United States Patent
Fujita et al.

[11] Patent Number: 6,120,348
[45] Date of Patent: Sep. 19, 2000

[54] POLISHING SYSTEM

[75] Inventors: Takashi Fujita; Masafumi Goto; Kunio Nomoto, all of Osaka, Japan

[73] Assignee: Sumitomo Metal Industries Limited, Osaka, Japan

[21] Appl. No.: 09/323,250

[22] Filed: Jun. 1, 1999

Related U.S. Application Data

[63] Continuation of application No. 08/938,752, Sep. 26, 1997.

[30] Foreign Application Priority Data

Sep. 30, 1996 [JP] Japan ................... 8-258008

[51] Int. Cl.⁷ ........................................ B24B 1/00
[52] U.S. Cl. ..................... 451/5; 451/63; 451/41; 451/287
[58] Field of Search ................. 451/5, 6, 8, 21, 451/28, 41, 63, 56, 287, 288, 289, 259, 272, 274

[56] References Cited

U.S. PATENT DOCUMENTS

| | | | |
|---|---|---|---|
| 4,407,094 | 10/1983 | Bennett et al. . | |
| 4,910,155 | 3/1990 | Cote et al. | 451/211 |
| 5,308,438 | 5/1994 | Cote et al. | 156/636 |
| 5,433,650 | 7/1995 | Windebarger | 451/41 |
| 5,492,594 | 2/1996 | Burke et al. . | |
| 5,643,044 | 7/1997 | Lund | 451/5 |
| 5,664,987 | 9/1997 | Renteln | 451/21 |
| 5,672,091 | 9/1997 | Takahashi et al. . | |
| 5,672,095 | 9/1997 | Morimoto et al. | 451/41 |
| 5,722,875 | 3/1998 | Iwashita et al. . | |

FOREIGN PATENT DOCUMENTS

| | | |
|---|---|---|
| 0547894A1 | 6/1993 | European Pat. Off. . |
| 0623423A1 | 11/1994 | European Pat. Off. . |
| 0648575A1 | 4/1995 | European Pat. Off. . |
| 113218 | 7/1982 | Japan . |
| 5-285825 | 11/1993 | Japan . |
| 8-17768 | 1/1996 | Japan . |
| 8-174411 | 7/1996 | Japan . |
| 8-174417 | 7/1996 | Japan . |

*Primary Examiner*—Derris H. Banks
*Attorney, Agent, or Firm*—Venable; Laurence J. Marhoefer

[57] ABSTRACT

A polishing method characterized by measuring the thickness of a film of a monitoring piece to be polished which is to be used exclusively for monitoring polishing amount, and obtaining polishing amount on the basis of the results of measurement, and judging, on the basis of the resulting polishing amount, setting/change of polishing condition of a polishing object, whether it is necessary or not to replace a polishing pad, and/or completion of run-in polishing after replacement of the polishing pad, and an apparatus to be used for practicing same.

24 Claims, 15 Drawing Sheets

LEVEL1   $A \leqq R_p \leqq B$
LEVEL2   $C \leqq R_p < A, B < R_p \leqq D$
LEVEL3   $R_p < C, D < R_p$

POLISHING SYSTEM

This application is a continuation of application Ser. No. 08/938,752 filed Sep. 26, 1997.

BACKGROUND OF THE INVENTION

The present invention relates to a polishing system for polishing objects such as wafers, glass substrates, and the like which have films on their surfaces.

For example, in the manufacturing process of Large Scale Integration (LSI), wiring patterns for forming transistors, capacitors, and the like are formed on a silicon wafer substrate or the like, and further an insulating film is formed over the whole surface. At such time, the underlying wiring pattern causes parts of the surface of the insulating film to be uneven. In the recent LSI manufacturing technique, in order to make the wiring pattern multi-layered, the insulating film having the uneven surface is required to be flattened. In order to flattenier level the insulating film having the uneven parts, a Chemical Mechanical Polishing (CMP) method is generally utilized.

In case of carrying out successively polishing of the films such as an insulating film having the uneven parts formed on the wafer by CMP method, there is used in general a method of previously measuring polishing speed, estimating the polishing time based on the polishing speed, and effecting polishing at the estimated polishing time. According to this method, in case the polishing speed and uniformity in the wafer surface thereof are stabilized with time, the wafer can be polished in stabilized state for a long duration.

However, the polishing speed varies depending on the change with time of the surface condition of a polishing pad, irregularity of quality of the polishing slurry, and the like accordingly, in case of a necessity to control polishing amount in high precision, the change with time of the polishing speed is required to be considered.

As a method for considering the change with time of the polishing speed, in case of polishing the wafer provided with a film having the uneven parts successively, there is proposed a method of obtaining thickness of the film before and after the polishing with an optical film thickness gauge, obtaining polishing speed, and then reset polishing time (Japanese Patent Application Laid-Open No. 8-17768 (1996).

According to this method, the polishing time can be varied in accordance with the change with time of the polishing speed, and therefore the polishing amount can be kept a constant value.

According to this method, however, the wafer to be the product such as LSI (hereinafter to be referred to as "product wafer"), i.e., wafer provided with a film having convex and concave regions, is used for measuring the polishing speed, so that it involves the following problems.

(1) Because of the fine patterns formed on the product wafer, even on slight displacement of the measuring position, change occurs in the film base, such as for example from silicon to aluminum. For this reason, if there is any displacement in the measurement position, then the measured amount of the film thickness becomes inaccurate.

(2) Depending on convex or concave part, if there is a slight displacement in the measurement position, the film thickness varies to a considerable degree. Therefore, it is difficult to measure the film thickness accurately.

(3) In recent years, there are frequently cases where, with the object of preventing reflection, an intermediate film of TiN or the like is used for the base of the film. In such a case, due to the presence of the intermediate film, precision of film thickness measurement is degraded.

As described above, in case a product wafer is used for measuring the polishing speed, there is a problem to make the film thickness measurement value inaccurate. When the film thickness measurement value is inaccurate, evaluation of the polishing amount (polishing speed) becomes inaccurate, and proper determination of the polishing time cannot be made, so that the desired amount of polishing can not be obtained.

In order to obviate such problem of measurement, there may be conceived to measure the film thickness of only the peripheral part of the wafer on which no LSI device is formed, i.e., without having convex or concave part. However, by only the measurement of the film thickness of the peripheral part of the wafer, it is not possible to evaluate the polishing situation at the central part of the wafer on which the LSI device is practically to be formed. Furthermore, it is also difficult to evaluate the uniformity inside the wafer surface which is an important index.

Furthermore, in case of replacement of the polishing pad in the CMP device, the polishing process for the product wafer is started after the following trial operation.

First, in order to stabilize the wafer polishing situation, break-in polishing is carried out. This is a processing to place a dummy wafer for break-in polishing such as silicon wafer (hereinafter to be referred to as "dummy wafer") on a sample stage and continue polishing to make the polishing slurry sufficiently be absorbed by the polishing pad.

The time of completion of the break-in polishing (i.e., the starting point of polishing the product wafer) is determined by experience by the worker. However, the worker's judgment by experience is apt to cause errors.

BRIEF SUMMARY OF THE INVENTION

The present invention has been devised to solve the above problems. It is therefore an object of the present invention to provide a polishing system in which, in polishing an object to be polished, it is possible to meet the change with time of the polishing situation such as polishing speed attributed to the degradation of the polishing pad or the like, and to expect stabilization of the polishing amount and uniformity in the surface thereof.

The polishing system according to the present invention is characterized by measuring the change in thickness of the film in an object to be polished which is to be used exclusively for monitoring the polishing amount (hereinafter to be referred to as "monitoring piece"), and obtaining the polishing amount based on the results of measurement.

As the polishing amount is to be measured by using the monitoring piece independent from the polishing object, even if the object to be polished has uneven parts on the surface, the polishing amount can be accurately determined without respect to such irregularities.

The object to be polished is, for example, a wafer for the product on the surface of which an LSI device is to be formed, on the surface of which a film having convex and concave regions is formed. On the other hand, the monitoring piece is an object to be polished, to be used for evaluating the polishing situation, and is a sample having formed on the surface a film such as a thermal oxidation film, or a plasma oxidation film (e.g., $SiO_4$—$O_2$ type plasma oxidation film (P—SiO film), and TEOS (Tetra Ethyl Ortho Silicate: $Si(OC_2H_5)_4$)—$O_2$ type plasma oxidation film (P-TEOS film)) or the like. Further, preferably, the film of the monitoring piece is flat without pattern formation, and its film thickness is uniform.

The invention is further characterized by judging, on the basis of the change in thickness of the monitoring piece film resulting from polishing (=polishing amount), setting/change of the polishing conditions of the product wafer, requirement to change or not to change of the polishing pad, and/or completion of the run-in polishing after replacement of the polishing pad (i.e., adequacy or not of the start of polishing of the predetermined object of polishing).

For example, it is possible to obtain a polishing speed from the polishing amount. Moreover, by setting a plurality of measuring points on one polishing object, various indices such as uniformity in surface of the polishing amount, polishing shape tendency value, and the like can be obtained. Furthermore, in an apparatus with which a plurality of objects to be polished can be processed in a single polishing process (1 batch), it is possible to obtain uniformity in a batch by providing a measuring point on each of all polishing objects placed on the respective positions.

Accordingly, in the present invention, proper setting and change of the polishing conditions can be automatically practiced on the basis of the index value by obtaining the index necessary for setting/change of for example the polishing conditions (e.g., polishing speed, uniformity in plane of the polishing speed, and the like) from the polishing amount.

Also, it is possible to judge automatically by the apparatus the necessity or not of replacement of the polishing pad by obtaining an index necessary for judgment of the requirement or not of the polishing pad (e.g., polishing speed, uniformity in plane of the polishing speed, and the like) from the resulting polishing amount.

Furthermore, in the run-in polishing after replacement of the polishing pad, by obtaining the polishing amount, completion of the run-in polishing can be judged by the apparatus and polishing of the wafer for product can be automatically started.

According to these constitutions, due to the curtailment of the portions participated by the person, the work can be performed efficiently, and because of the judgment not being dependent on the personal experience, scattering of judgments is small. Consequently, polishing amount of the object to be polished such as wafers for product, uniformity in the plane of the polishing amount, and the like can be stabilized.

These constitutions can be adequately combined to obtain the individual effects.

The polishing system according to the present invention is equipped with a CMP device, a washing device, a film thickness measuring gauge, a container for storing the monitoring pieces as mentioned above, a carrier for circulating in order of the container, polishing device, washing device, measuring device, and the container, and a calculating unit. And, by making the thickness of the film of the monitoring piece sufficiently thick, the monitoring piece can be used in repetition. As a result, frequency of carrying in and out of the monitoring piece can be reduced, and operation rate of the apparatus can be improved.

The above and further objects and features of the invention will more fully be apparent from the following detailed description with accompanying drawings.

DETAILED DESCRIPTION OF THE INVENTION

Hereinafter, the present invention is described in detail with reference to the drawings which show the embodiments thereof. For example, a wafer for manufacturing LSI is called a product wafer, a wafer for monitoring polishing amount is called a monitor wafer, and a wafer for run-in polishing is called a dummy wafer.

Embodiment 1

Figure 1:
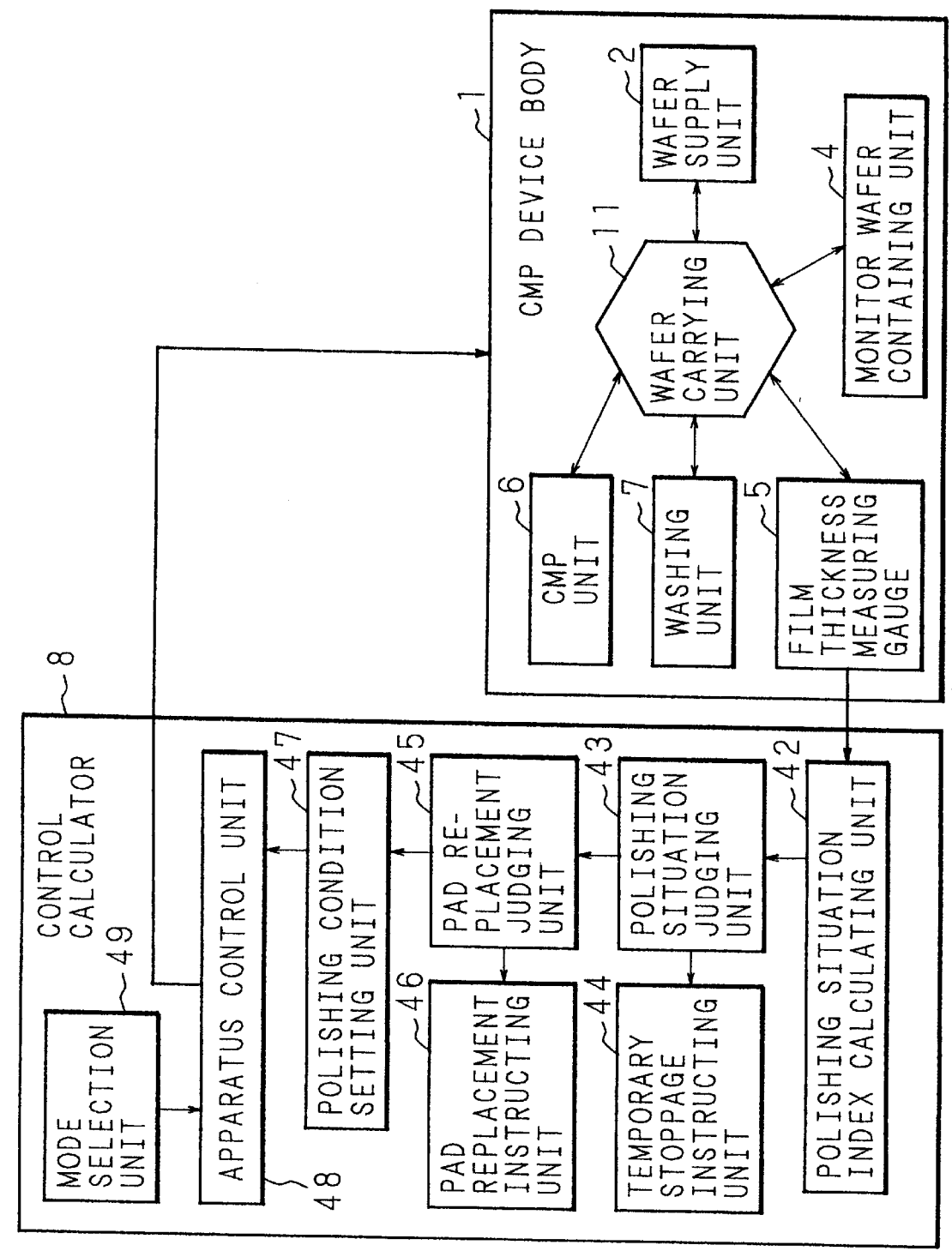
FIG. 1 is a block diagram showing a constitution of a CMP device according to Embodiment 1.

FIG. 1 is a block diagram showing a polishing system according to Embodiment 1. This polishing system comprises a CMP device body 1 and a control calculator 8 for controlling the same.

The CMP device body 1 comprises a wafer supply unit 2, a monitor wafer containing unit 4, a film thickness measuring unit 5, a CMP unit 6, a washing unit 7, and a wafer carrier unit 11.

According to the processing mode set and indicated from the control calculator 8, each unit of the CMP device body 1 is constituted to operate in cooperation. Processing mode includes, for example, a product wafer polishing processing mode, monitor wafer containing processing mode, monitor wafer polishing processing mode, and monitor wafer recovery processing mode.

The product wafer polishing processing mode is a mode to make polishing processing of the product wafer. The product wafer is carried to the CMP unit 6 and the washing unit 7 from a product wafer cassette stored in the wafer supply unit 2, subjected to CMP and washing processes, and returned to the product wafer cassette in the wafer supply unit 2.

The monitor wafer containing processing mode is a mode to store the monitor wafer in the monitor wafer containing unit 4. The monitor wafer is transmitted to the film thickness measuring unit 5 from a monitor wafer cassette housed in the wafer supply unit 2, and after measurement of the film thickness, stored in the monitor wafer containing unit 4.

The monitor wafer polishing processing mode is a mode to polish the monitor wafer and to measure the polishing amount. The monitor wafer is carried to the CMP unit 6 and washing unit 7 from the monitor wafer containing unit 4, subjected to polishing and washing processes, carried to the film thickness measuring unit 5, and after measurement of the film thickness, returned to the monitor wafer containing unit 4.

The monitor wafer recovery processing mode is a mode for carrying the monitor wafer outside the apparatus from the monitor wafer containing unit 4. The monitor wafer is transmitted to an empty monitor wafer cassette contained in the wafer supply part 2 from the monitor wafer containing unit 4 and withdrawn there.

The control calculator 8 comprises a polishing situation index calculating unit 42, a polishing situation judging unit 43, a temporary stoppage instructing unit 44, a pad replacement judging unit 45, a pad replacement instructing unit 46, a polishing condition setting unit 47, an apparatus control unit 48, and a mode selection unit 49.

The polishing situation index calculating unit 42 comprises a film thickness memory unit and a calculation unit. The film thickness memory unit stores the thickness of the film obtained in the film thickness measuring unit 5, and the calculation unit calculates the polishing amount (that is, the amount or thickness of the layer removed in polishing the monitoring piece) and other indexes showing the polishing situation (hereinafter to be referred to individually or collectively as the polishing situation index) from the film thickness prior to polishing stored in the film thickness memory unit and the film thickness after polishing.

The polishing situation judging unit 43 judges as to whether the polishing situation index obtained in the polishing situation index calculating unit 42 is within the allowable range or not. Namely, it judges whether there is any deficiency unit in the polishing situation or not, and whether the polishing is properly carried out or not. The temporary stoppage instructing unit 44 instructs temporary stoppage of the CMP device body 1 when the polishing situation index is not within the allowance range.

The pad replacement judging unit 45 judges whether the polishing pad is to be replaced or not on the basis of the polishing situation index. The pad replacement instructing unit 46 instructs to replace the polishing pad when judgment is made to replace the polishing pad.

The polishing condition setting unit 47 sets the polishing conditions for the product wafer. Firstly, judgment is made as to whether the change of the polishing conditions is necessary or not, from the polishing situation index. The polishing condition is changed when judgment is made that the change of the polishing conditions is necessary.

The mode selection unit 49 selects any of the product wafer polishing processing mode, monitor wafer containing processing mode, monitor wafer polishing processing mode, and monitor wafer recovery processing mode as described above. The apparatus control unit 48 indicates the operation to the CMP device body 1 on the basis of the indication from the mode selection unit 49.

The polishing situation index is explained. As the polishing situation index, there may be used, for example, polishing amount, uniformity of polishing amount in wafer plane, uniformity of polishing amount in batch, inclination amount of polishing shape, average polishing speed, and the like. In the present specification, "1 batch" is referred to by one time polishing with the apparatus which polishes a plurality of wafers at the same time.

Figure 4:
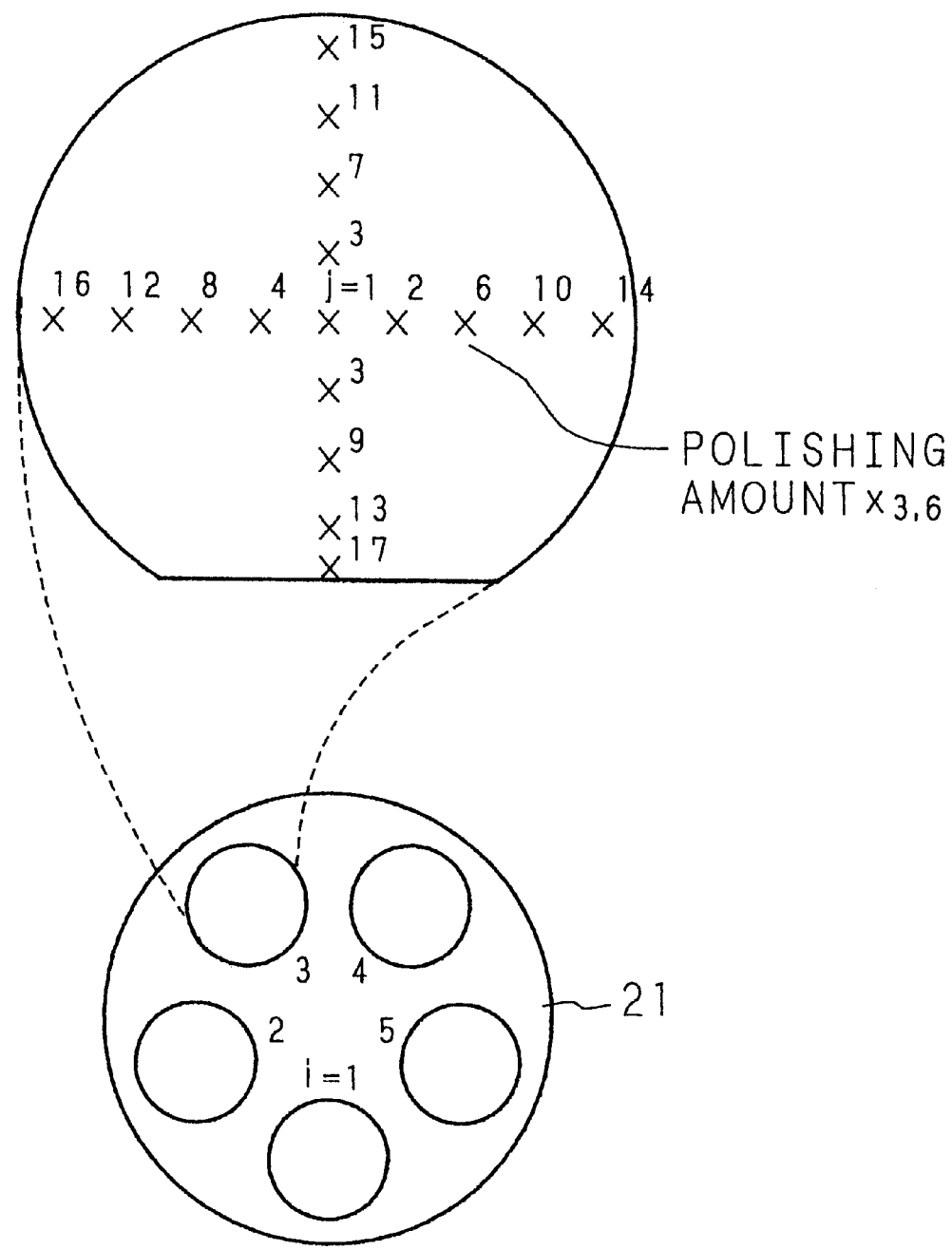
FIG. 4 is a schematic plan view showing measuring points on a wafer and a wafer table.

FIG. 4 is a schematic plan view showing measuring points on the wafer and a wafer table. On the wafer table 21, there are placed five wafers, and 5 wafers can be polished in one batch. Also, on the wafer there are set 17 film thickness measuring points aligned in a cross line form.

The polishing amount $x_{ij}$ (i=1–5, j=1–17) is obtained by subtracting the film thickness after the polishing from the film thickness before polishing. Here, the mark i is a number of the 5 wafers of one batch, and j shows a measuring point on one wafer.

The average polishing amount by wafer $\bar{x}_i$, average polishing amount in one batch $\bar{\bar{x}}$, uniformity of polishing amount in plane by wafer $\sigma_i$, uniformity in batch S, inclination amount of polishing shape $K_i$, and average polishing speed $R_p$, may be computed by Equations (1)–(10), on pages 39 and 40 wherein max is the maximum value in parentheses, min is the minimum value in parentheses. The mark $t_{mon}$ is a polishing time for the monitor wafer. The polishing shape inclination amount $K_i$ is, as seen from its definition equation (9), representative of an inclination of the difference of polishing amounts between the central part of wafer and the peripheral part of wafer.

Equations (1)–(10)

Next, a polishing method according to the present invention is explained.

Figure 2:
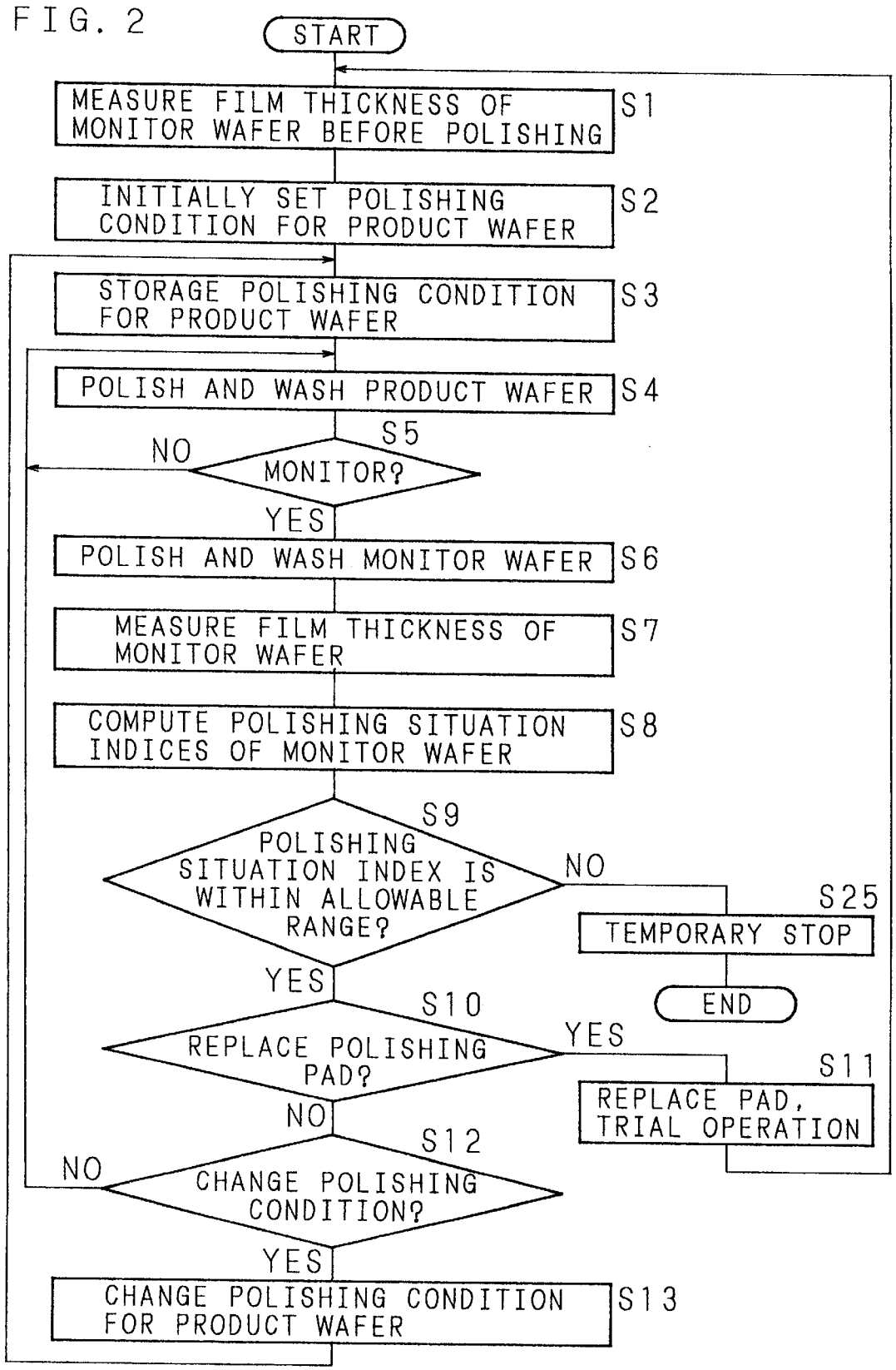
FIG. 2 is a flow chart showing a processing procedure of a polishing method in Embodiment 1.

FIG. 2 is a flow chart showing the processing procedure of the polishing method according to the present invention.

(1) Previously, the thickness of the film of the monitor wafer is measured by the film thickness measuring unit 5 (Step S1). The film thickness is stored in the polishing situation index calculating unit 42 in the control calculator 8 as a film thickness prior to polishing of the monitor wafer.

This measurement is carried out in the monitor wafer containing processing mode as described above. Also, by carrying out this mode simultaneously with the trial operation after replacement of the polishing pad, reduction of time loss can be done. In case of the completion of the monitor wafer containing processing at the time of the trial operation after replacement of the polishing pad, the step S1 may be omitted.

(2) The polishing conditions for the product wafer are to be set initially at the polishing condition setting unit 47 (Step S2). The polishing conditions include polishing time, rotation speed of wafer table 21, rotation speed of polishing pad, load of polishing pad, kind and flow volume of polishing slurry, temperature of washing liquid, washing speed, and the like, which may be determined by the result of the trial operation after replacement of the polishing pad.

(3) The polishing conditions for the product wafer are stored in the apparatus control unit 48 (Step S3).

(4) On the basis of the stored polishing conditions, the CMP unit 6 polishes the product wafer, and the washing unit 7 washes it (Step S4, product wafer polishing processing mode).

(5) Whether to monitor the polishing situations or not is judged by the apparatus control unit 48 (Step S5). This judgment may be made by the number of processing of the product wafer and the like. For example, it is determined to monitor every 50 wafers (2 cassettes).

In case of it is judged not to monitor (a predetermined number of wafers are not done), the process returns to the processing step S4 of product wafer.

(6) In case of it is judged to monitor (the predetermined number is attained), the monitor wafer is polished on the basis of the predetermined polishing conditions and washed (Step S6, monitor wafer polishing processing mode). The polishing conditions of the monitor wafer may be the same as those of the product wafer, and the polishing time may be shortened.

(7) The thickness of the film of the polished and washed monitor wafer is measured at the film thickness measuring unit 5 (Step S7, monitor wafer polishing processing mode).

(8) From the results of measurement of the film thickness, the polishing situation index calculating unit 42 computes the polishing situation indices such as the polishing amount, in plane uniformity of polishing amount on one wafer, uniformity in batch of polishing amount, polishing shape inclination amount, average polishing speed, and the like (Step S8).

(9) The polishing situation judging unit 43 judges whether the resulting polishing situation index is within the allowable range or not (Step S9).

Figure 3:
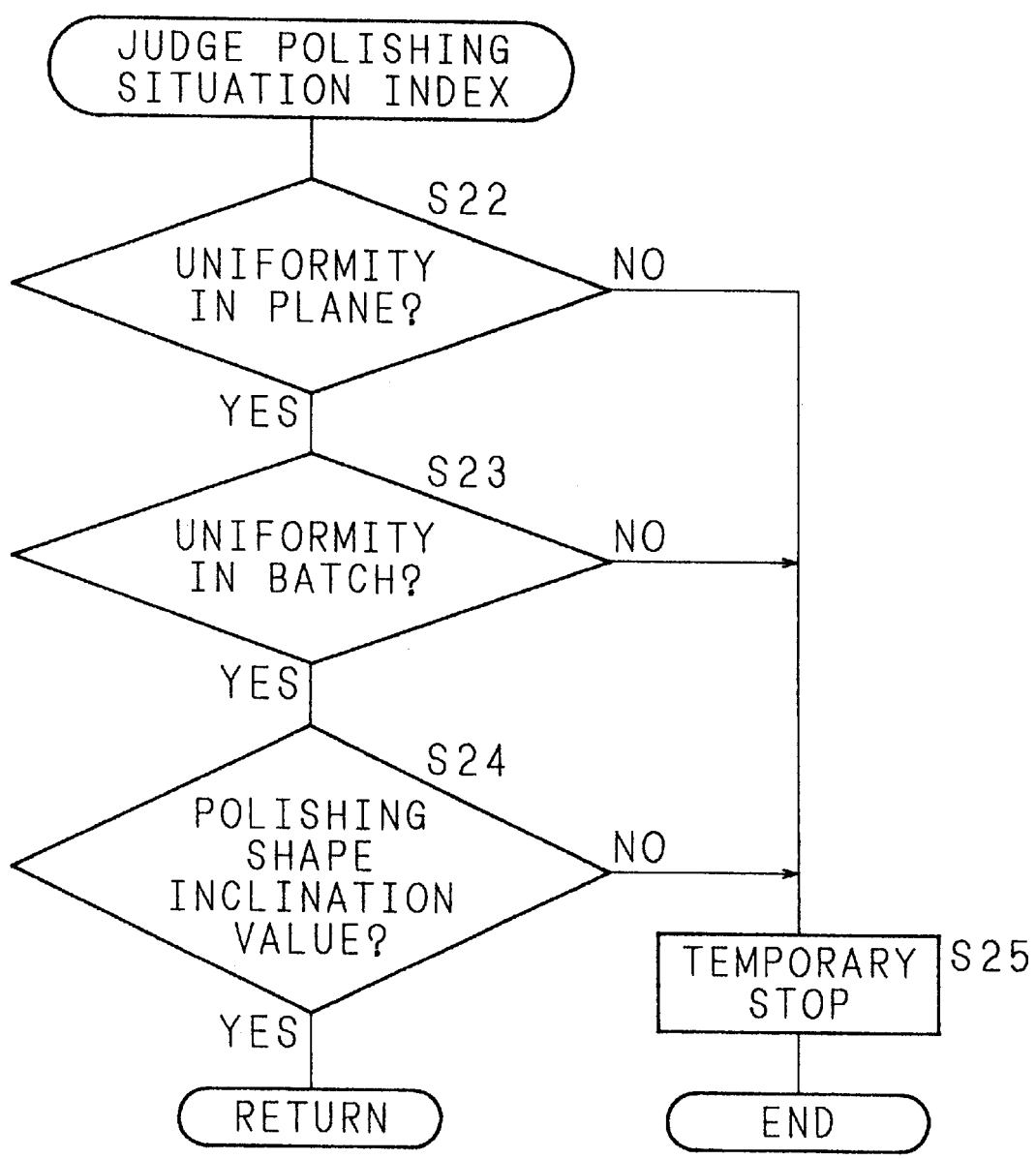
FIG. 3 is a flow chart showing the judgment step of an index of polishing situation of FIG. 2.

FIG. 3 is a flow chart showing concretely Step S9. First, judgment is made as to whether the uniformity in plane $\sigma_i$ of the polishing amount is within the permissible range ($\sigma_i<4\%$) or not (Step S22), and if it is within the range, judgment is made as to whether the uniformity in batch S of the polishing amount is within the allowable range ($-2\%<S<2\%$) or not (Step S23), and if it is within the range, judgment is made as to whether the polishing shape inclination value $K_i$ is within the allowable range ($-5\%<K_i<5\%$) or not (Step S24). In case it is judged to be outside the allowable range in Steps S22, S23, and S24, the temporary stoppage instructing unit 44 displays an error, stops temporarily the processing of the CMP device body 1 (Step S25), and terminates the processing of the control calculator 8.

In case the polishing situation index is outside the permissible range, there is a possibility for abnormality such as defective fixing of polishing pad, defective supply of slurry, or the like in the CMP device. In such a case, it is necessary to discontinue automatic operation with the control calculator 8 and make confirmation by the worker.

(10) In case that all the predetermined polishing situation indices are within the allowable range, the pad replacement judging unit 45 judges whether the polishing pad replacement is necessary or not, on the basis of, for example, whether the average polishing speed $R_p$ is within the predetermined range or not (Step S10). In case the replacement is judged to be necessary, by the instruction of the pad replacement instruction unit 46, the polishing processing is temporarily stopped and replacement of pad and trial operation are indicated (Step S11). Thereafter, the procedure is returned to step S1, pre-polishing film thickness measurement of monitor wafer is made, and processing is restarted.

(11) In case that the replacement of pad is judged to be unnecessary, on the basis of the status for example as to whether the average polishing speed $R_p$ is within the predetermined range or not, judgment is made as to whether the change of the polishing conditions of the product wafer is necessary or not, by the polishing condition setting unit 47 (Step S12).

Figure 5:
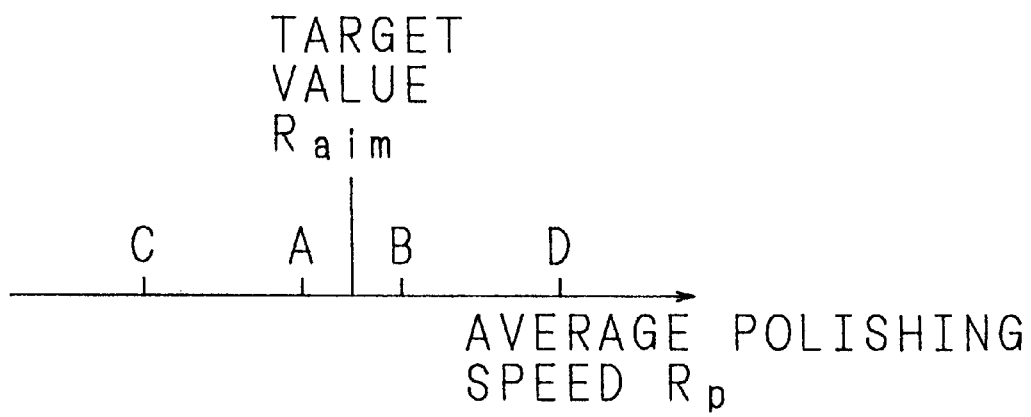
FIG. 5 is an explanatory view for illustrating a method of judging polishing pad replacement, and a method of judging change of polishing conditions.

There is explained with reference to FIG. 5 a method of using the average polishing speed $R_p$ in the judging step S10 for replacement of polishing pad and the judging step S12 for polishing condition change. To the target value $R_{aim}$ of the preset average polishing speed $R_p$, the ranges of the levels 1, 2, and 3 are set. In the examples shown in FIG. 5, values which are $C<A<R_{aim}<B<D$ are set, the level 1 is $A \leq R_p \leq B$, level 2 is $C \leq R_p \leq A$, $B \leq R_p \leq D$, and level 3 is $R_p<C$, $D<R_p$. And, judgment is made in the following manner.

In case the average polishing speed $R_p$ is in the range of level 3, replacement of the polishing pad is indicated. In case the average polishing speed $R_p$ is in the range of level 2, the polishing pad is not replaced, but the polishing conditions of the product wafer are changed. In case the average polishing speed $R_p$ is in the level 1 range, no replacement of polishing pad nor change of polishing conditions of the product wafer is practiced.

In Step S12, in case the change of the polishing conditions is judged to be necessary, the polishing condition setting unit 47 changes the polishing conditions for the product wafer to proper conditions (Step S13).

In Step S13 for change of the product wafer polishing conditions, for example, the polishing time is changed. In this case, using the conversion function f [Equation (11)] between the previously obtained average polishing speed of the monitor wafer film and the average polishing speed of the product wafer, an average polishing speed $R_p'$ of product wafer is obtained from the average polishing speed $R_p$ of the monitor wafer. 'k' in Equation (11) is a proportional constant, to be determined by the difference between the kind of the film which is the object to be polished in the product wafer and the kind of the film in the monitor wafer, and by the convex and concave shape of the product wafer. Furthermore, a predetermined target polishing amount $x_{aim}$ is divided by the average polishing speed $R_p'$ of the product wafer to obtain a proper polishing time $t_p$ [Equation (12)]. And, the polishing time of the product wafer may be set to the proper polishing time $t_p$.

Equations (11) & (12)

And, after change of the polishing conditions, the process is returned to Step S3, the changed polishing conditions are stored in the apparatus control unit 48, and the polishing processing of the product wafer (Step S4) is re-started.

In Step S12, when the change of the polishing conditions of the product wafer is judged to be unnecessary, without changing the polishing conditions of the product wafer, the polishing processing of product wafer (Step S4) is re-started.

With the polishing method and CMP device as described above, the polishing amount is measured by using a monitor wafer different from the product wafer, the monitor wafer having a film of uniform thickness on the surface, so that it is possible to measure the polishing amount accurately and evaluate the polishing situation accurately. Accordingly, the change with time of the polishing situation such as polishing speed attributed to the degradation of the polishing pad, polishing slurry, and the like can be met by the change of polishing conditions, or by replacement of the polishing pad, whereby the polishing amount and uniformity in the wafer plane of the polishing amount can be stabilized.

For the monitor wafer, there is used a silicon wafer on the surface of which about 5 $\mu$m of oxidized film is formed. The thickness of the film in the monitor wafer is desirably sufficiently thick, but in consideration of the measurable range with the optical film thickness gauge, an oxidized film of about 3–5 $\mu$m is formed in this embodiment. This film thickness is determined under restriction of the film thickness gauge, and is not to be limited to this range.

In Embodiment 1, there is shown an example in which the judgment of polishing pad replacement and change of polishing conditions are performed by the control calculator 8. Good effect is obtainable with the constitution containing either one only.

Namely, for example, when the constitution allows to make judgment on change of the polishing conditions and setting, it is possible to stabilize the polishing amount of product wafer, uniformity of polishing amount in plane of the wafer, and the like can be stabilized.

In case of the constitution being such as to allow judgment on replacement of polishing pad, it is possible to judge pertinently degradation of the polishing pad and stabilize the polishing amount of the product wafer, uniformity in wafer plane of polishing amount, and the like.

In Embodiment 1, as shown in the flow chart of FIG. 2, a polishing situation judging step S9 is provided, so that it is possible to judge first if there is any deficiency in polishing situation or not, and in case of deficiency, the processing is temporarily stopped to remove the deficiency. As a result, the polishing amount of the product wafer, uniformity in wafer plane of the polishing amount, and the like can be stabilized.

Embodiment 2

Figure 6:
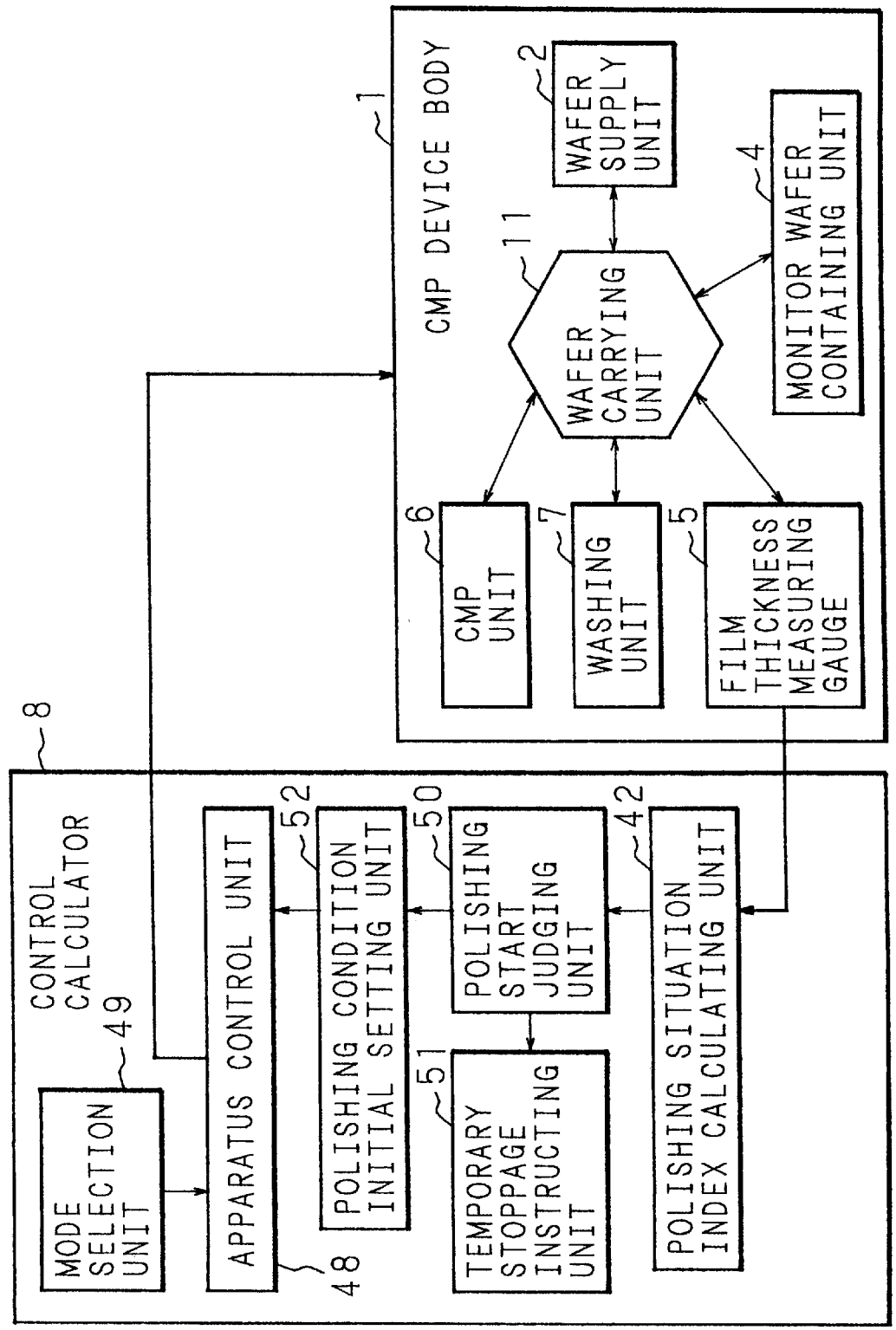
FIG. 6 is a block diagram showing a constitution of a CMP device according to Embodiment 2.

FIG. 6 is a block diagram showing a CMP device according to Embodiment 2, which gives an example in which run-in polishing after the polishing pad replacement judgement of completion of the running-in polishing can be automatically performed. This CMP device comprises, as similar to Embodiment 1, a CMP device body 1 and a control calculator 8 to control it. However, the constitution in the control calculator 8 and the kind of the processing mode are different from those of Embodiment 1.

The control calculator 8 comprises a polishing situation index calculating unit 42, a polishing start judging unit 50, a temporary stoppage indicating unit 51, a polishing condition initial setting unit 52, an apparatus control unit 48, and a mode selection unit 49.

The polishing situation index calculating unit 42 comprises, as similar to that in Embodiment 1, a film thickness memory unit and an calculation unit, and operates the polishing situation index such as polishing amount on the basis of the film thickness prior to polishing and the film thickness after polishing.

The polishing start judging unit 50 judges whether the polishing situation index is within the allowable range or not, and instructs to start polishing of the product wafer. The temporary stoppage instructing unit 51 instructs temporary stoppage of the apparatus on the basis of the judgment of the polishing start judging unit 50.

The polishing condition initial setting unit 52 initially sets the polishing conditions for the product wafer at starting polishing of the product wafer.

With respect to the mode that can be selected by the mode selection unit 49, there is further set, in addition to the product wafer polishing processing mode, monitor wafer containing processing mode, monitor wafer polishing processing mode, and monitor wafer recovery processing mode similar to those of Embodiment 1, a dummy wafer polishing processing mode.

The dummy wafer polishing processing mode is a mode to carry out run-in polishing by a dummy wafer (e.g., a silicon wafer on which no film is formed). The dummy wafer is carried to the CMP unit 6 and washing unit 7 from a dummy wafer cassette which is housed in the wafer supply unit 2, polished and washed, and then returned to the dummy wafer cassette on the wafer supply unit 2.

The apparatus control unit 48 gives instruction such as processing mode, polishing conditions, and the like to the CMP device body 1 to operate it, in the same manner as in Embodiment 1.

Figure 7:
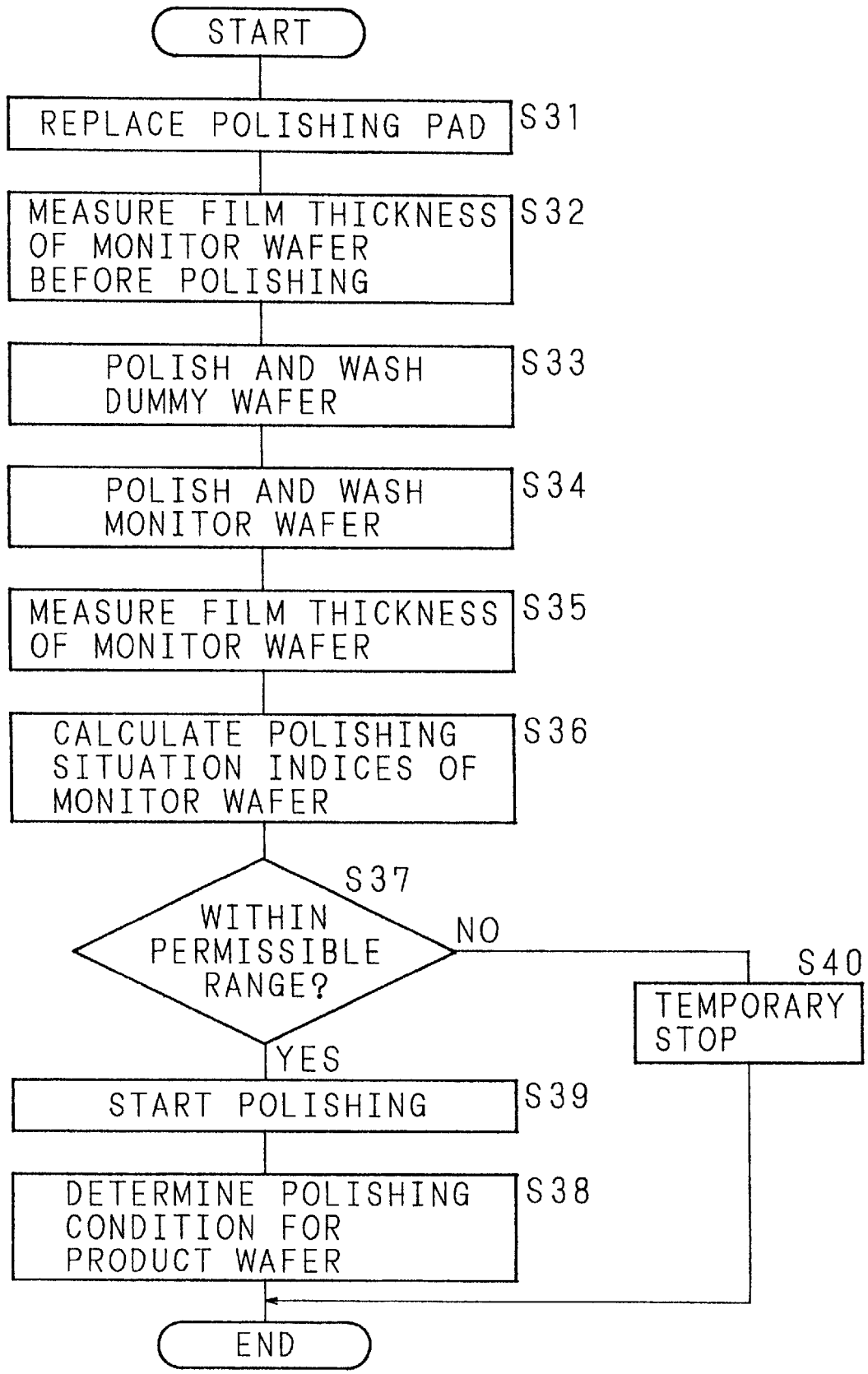
FIG. 7 is a flow chart showing a processing procedure for polishing method in Embodiment 2.

FIG. 7 is a flow chart which shows processing procedure of a polishing method in Embodiment 2, wherein there is explained the trial operation including the run-in polishing at the time of the replacement of the polishing pad.

(1) The polishing pad is replaced (Step S31).

(2) The thickness of the film of the monitor wafer is measured by the film thickness measuring unit 5 in advance (Step S32) and the polishing situation index calculating unit 42 of the control calculator 8 stores it (monitor wafer containing processing mode).

(3) The dummy wafers of the predetermined number of batches are polished and washed in the CMP unit 6 and washing unit 7 (Step S33, dummy wafer polishing processing mode), and the polishing slurry is sufficiently adapted into the polishing pad. The batch number may be determined by experience. In this embodiment, the polishing processing of 3 minutes a batch is carried out for 4 batches.

(4) The monitor wafer is polished under the predetermined polishing conditions in the CMP unit 6 and the washing unit 7, and washed (Step S34, monitor wafer polishing processing mode).

(5) The thickness of the film of the monitor wafer is measured with the film thickness measuring unit 5 using, for example, an optical film thickness gauge (Step S35, monitor wafer polishing processing mode).

(6) From the results of measuring the film thickness the polishing situation index calculating unit 42 calculates the polishing situation indices of the monitor wafer such as polishing amount, uniformity in wafer plane of polishing amount, polishing shape inclination value, average polishing speed, and so on. (Step S36).

(7) The polishing start judging unit 50 judges whether the calculated polishing situation index is within the permissible range or not (Step S37), and if it is within the range, it instructs the start of polishing of the product wafer (Step S39). This judgment may be performed in the same manner as the polishing situation index judgment of FIG. 3. In case the polishing situation index is not within the allowable range, processing of the CMP device body 1 is temporarily stopped (Step S40), and for example the worker is caused to confirm the condition of fixing the polishing pad, and the like to finish the processing of the control calculator 8.

(8) In case the start of polishing is instructed, the polishing condition initial setting unit 52 sets the polishing conditions of the product wafer such as the polishing time (Step S38). As the polishing time, for example, a moderate polishing time $t_p$ obtainable in Equation (11) may be used.

(9) The trial operation is terminated and polishing processing of the product wafer is started (product wafer polishing processing mode).

In the CMP device and polishing method as described above, the trial operation process including the run-in polishing after replacement of the polishing pad can be carried out in good efficiency almost without intervention of man's hand.

Furthermore, as the film thickness is measured by using a monitor wafer having flat surface which is different from the product wafer having convex and concave parts on the surface as in Embodiment 1, the polishing situation including the polishing amount and polishing speed can be accurately evaluated. Consequently, at the time of the start of polishing the object to be polished for product, the polishing conditions of the product wafer can be appropriately determined.

Embodiment 3

Figure 8:
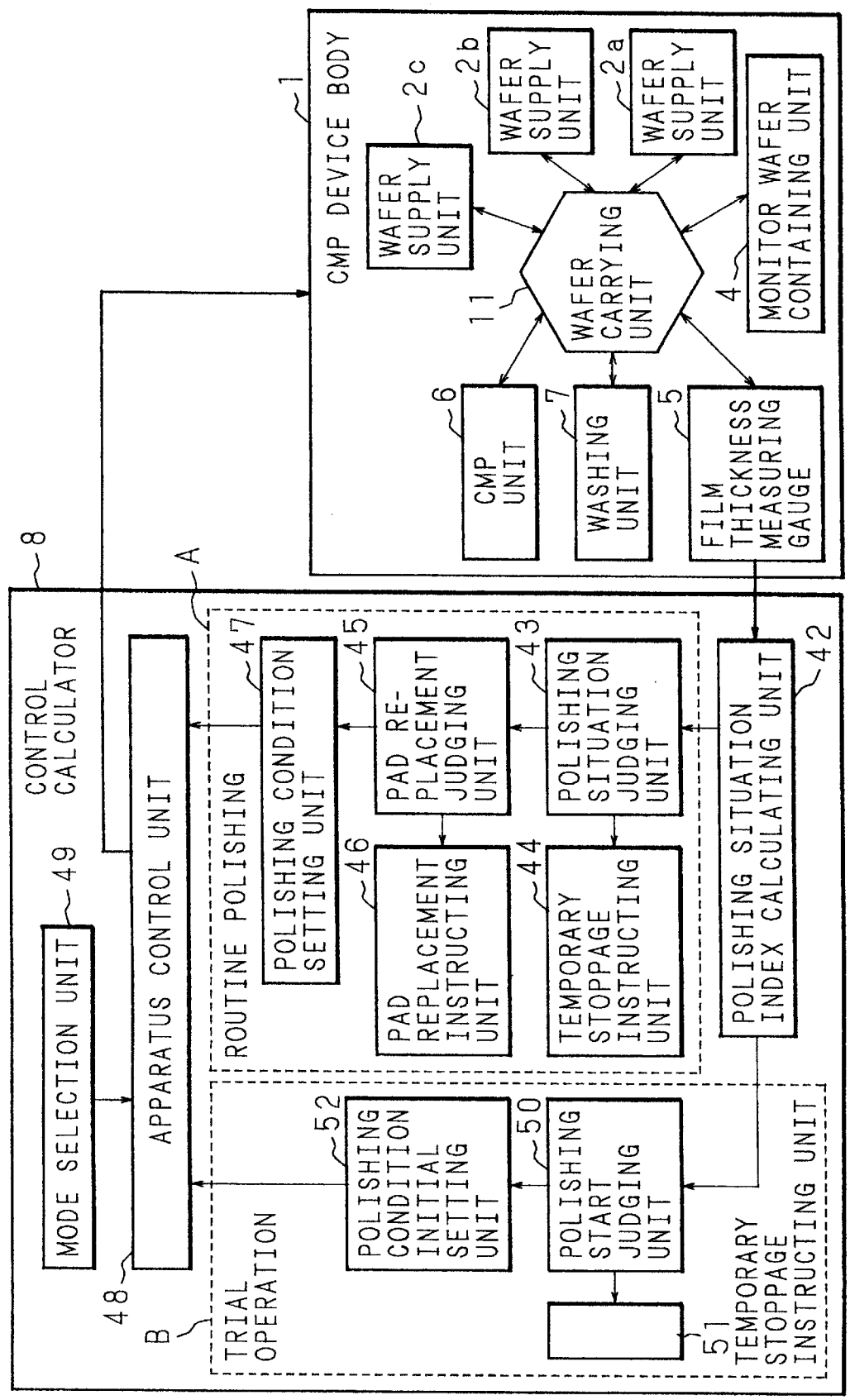
FIG. 8 is a block diagram showing a constitution of a CMP device according to Embodiment 3.

FIG. 8 is a block diagram showing a constitution of a CMP device according to Embodiment 3, having a constitution of combination Embodiment 1 and Embodiment 2. Also, using a schematic plan view showing the concrete disposition of the CMP device body 1, the wafer flow in the processing mode represented by the monitor wafer polishing process is concretely explained.

The CMP device of this embodiment comprises a CMP device body 1 and a control calculator 8 for controlling the same.

The CMP device body 1 comprises wafer supply units 2a, 2b, 2c, a monitor wafer containing unit 4, a film thickness measuring unit 5, a CMP part 6, a washing unit 7, and a wafer carrying unit 11. Each unit of the CMP device body 1 is constituted to operate in cooperation according to the instruction of the processing mode in the control calculator 8.

The control calculator 8 has a constitution in which it is possible to change over between a judging part A for practicing the routine product wafer polishing of FIG. 1 and a judging part B for practicing the trial operation after replacement of the polishing pad of FIG. 6. Accordingly, it is applicable to both the polishing process of the product wafer and the trial operation after replacement of the polishing pad.

The judging part A comprises a polishing situation judging unit 43, a temporary stoppage instructing unit 44, a pad replacement judging unit 45, a pad replacement instructing unit 46, and a polishing condition setting unit 47.

The judging part B comprises a polishing start judging unit 50, a temporary stoppage instructing unit 51, and a polishing condition initial setting unit 52.

The polishing situation index calculated by the polishing situation index calculating unit 42 is given to the polishing situation judging unit 43 of the judging part A and the polishing start judging unit 50 of the judging part B. The apparatus control unit 48 can receive the polishing conditions set by the polishing condition setting unit 47 of the judging part A and the polishing conditions set by the polishing condition initial setting unit 52 of the judging part B. The processing mode selected by the mode selection unit 49 is given to the apparatus control unit 48 in the same manner as in Embodiments 1 and 2.

With respect to the processing mode which can be selected by the mode selection unit 49, there are set the product wafer polishing processing mode, monitor wafer containing processing mode, monitor wafer polishing processing mode, monitor wafer recovery processing mode, and dummy wafer polishing processing mode, and so on as described above.

Figure 9:
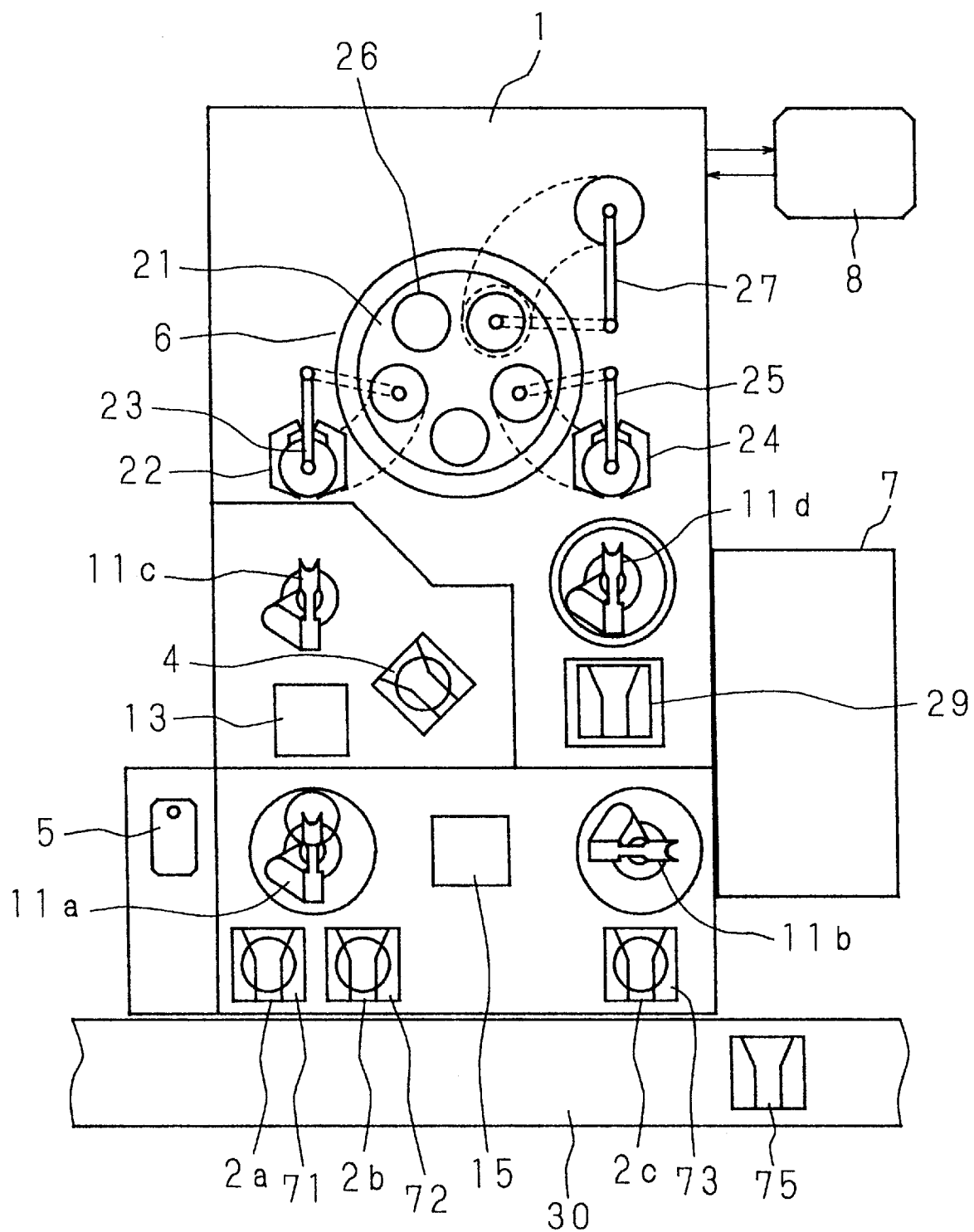
FIG. 9 is a schematic plan view of the CMP device body shown in FIG. 8.

FIG. 9 is a schematic plan view showing a concrete constitution of the CMP device body 1.

In front portion of the CMP device body 1, there are provided cassette ports (wafer supply unit) 2a, 2b for placing a product wafer cassette for loading and containing product wafers or a monitor wafer cassette for loading and containing monitor wafers, and a cassette port 2c for placing a dummy wafer cassette for loading and containing dummy wafers, on one side and the other side, respectively. In front of the CMP device body 1 there is set a cassette carrying device 30, which automatically carries the wafer cassettes to place the predetermined wafer cassette to any cassette port.

At the back of the cassette ports 2a, 2b, there is arranged a carrying robot 11a, and behind the cassette port 2c, there is disposed a carrying robot 11b. Between the carrying robots 11a and 11b, there is provided a wafer stage 15 for temporarily placing the wafer. In the rear of the carrying robot 11a there is a wafer stage 13 for temporarily placing the wafer, and at the back thereof there is provided a carrying robot 11c. On the lateral side between the wafer stage 13 and the carrying robot 11c there is a monitor wafer containing port (cassette) 4 which can contain 25 wafers.

On the further lateral side of the monitor wafer containing port 4, there is provided a delivery waiting port (cassette) 29, and behind the delivery waiting port 29 there is provided a carrying robot 11d.

Behind the monitor wafer containing port 4, there is provided the CMP part 6, and a wafer table 21 having 5 wafer holder 26 is provided at the middle part thereof. Above the wafer table 21 there is provided a polishing board having a polishing pad, which is made to be able to polish 5 wafers at the same time.

Between the carrying robot 11c and the wafer table 21 there are arranged a load side carrying arm 23 and a wafer load lift 22. Also, between the carrying robot 11d and the wafer table 21 there are installed an unload side carrying arm 25 and a wafer load lift 24.

Behind the unload side carrying arm 25 a scrub washing arm 27 is provided.

On the lateral side of the carrying robot 11d, delivery waiting port 29, and carrying robot 11b, there is externally provided the washing unit 7. The washing part 7 is furnished with a scrub washer and a spin dryer. In the scrub washer, while supplying demineralized water, a sponge made of polyvinyl alcohol (PVA) is brought into contact with the wafer, whereby the wafer is washed. In the spin dryer, the wafer is dried by revolving at high speed and blowing off the demineralized water on the wafer.

Figure 10:
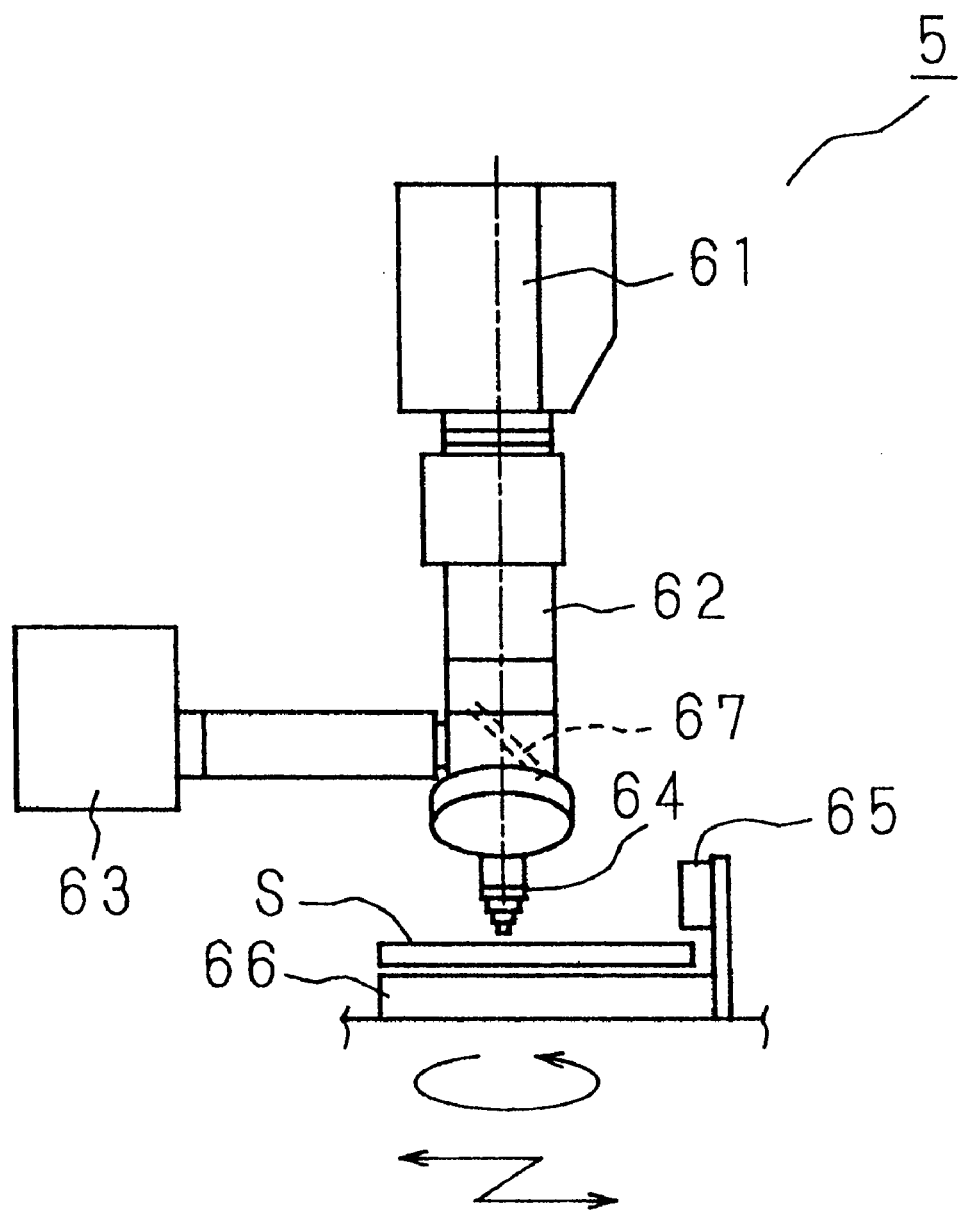
FIG. 10 is a schematic side view of the film thickness measuring part shown in FIG. 9.

On the lateral side of the cassette port 2a and the carrying robot 11a there is externally provided the film thickness measuring unit 5. FIG. 10 is a schematic side view showing the film thickness measuring unit 5. The film thickness measuring unit 5 is of an optical interference type with vertical arrangement of a spectrometer 61, a lens-barrel 62, a half mirror 67, and an objective lens in this order, and a light source 63 is provided on the lateral side of the half mirror 67. A wafer holding stage 66 of the film thickness measuring unit 5 comprises a horizontal sliding mechanism and rotary mechanism for fitting the measuring point positions, and a lift mechanism for focusing. Further, on the lateral side there are provided an orientation flat position fitting mechanism 65 for fitting orientation flat position and a wafer centering mechanism. By these mechanism, it is possible to measure an optional point of the wafer.

The monitor wafer S is fitted position by the orientation flat position fitting mechanism 65 and wafer centering mechanism, and by the indication of the control calculator 8 the predetermined measuring position is scanned and the film thickness is measured. The measured film thickness is sent to the calculator 8 for control and stored therein.

Next, explanation is given on the wafer flow in each processing modes to be practiced in such CMP device, i.e., on the wafer flow in monitor wafer containing processing mode, product wafer polishing processing mode, monitor wafer polishing processing mode, monitor wafer recovery processing mode, and dummy wafer polishing processing mode.

Figure 11:
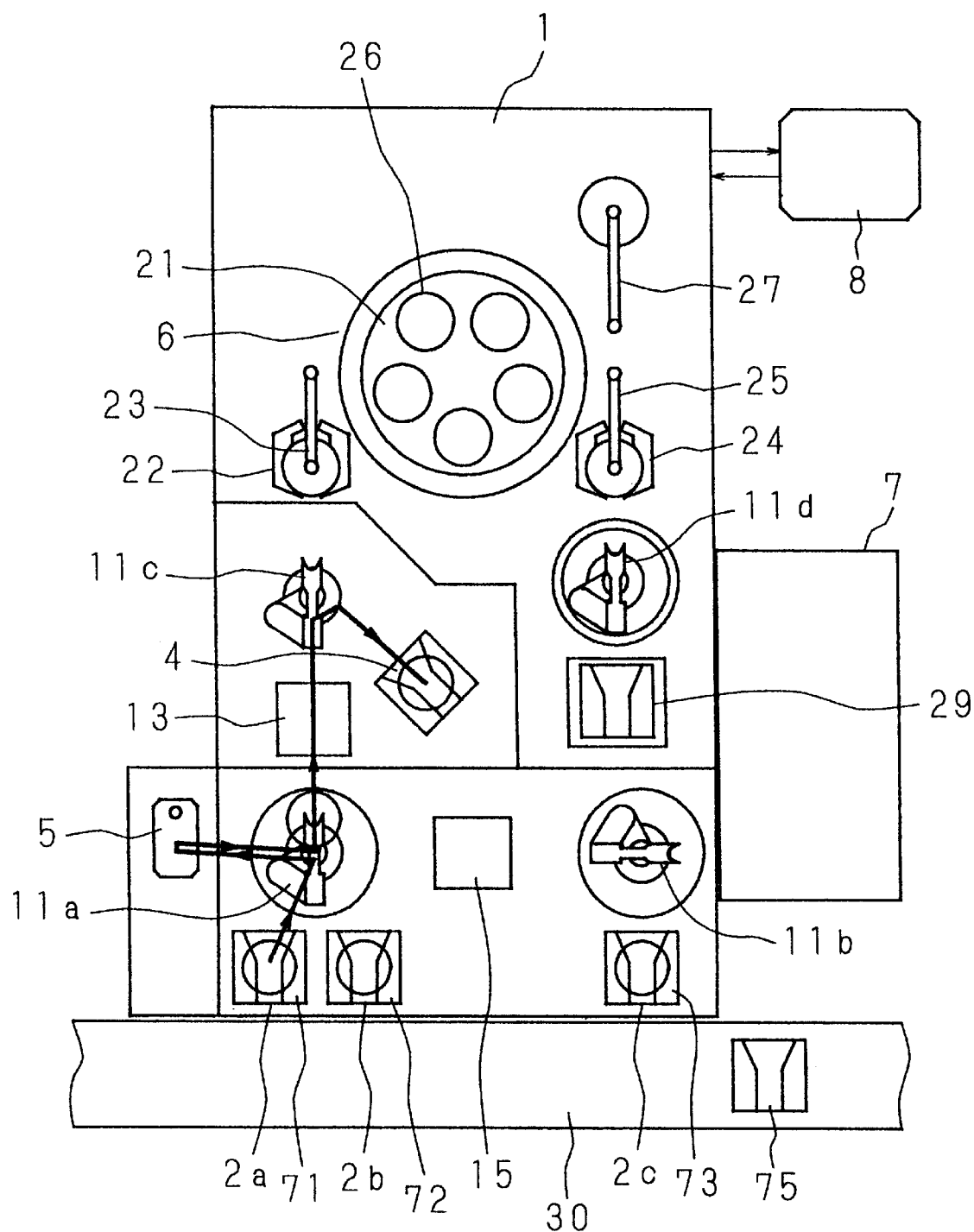
FIG. 11 is a schematic plan view showing a wafer flow in a monitor wafer containing processing mode.

FIG. 11 is a schematic plan view showing the wafer flow in the monitor wafer containing processing mode.

By the cassette carrying device 30, the wafer cassette 74 in which the monitor wafer is contained is carried and placed on the cassette stage 2a. Next, by the carrying robot 11a one monitor wafer is taken out from the wafer cassette 74 and carried to the film thickness measuring unit 5.

The monitor wafer undergoes film thickness measurement with the film thickness measuring unit 5, and the result of the film thickness measurement is stored in the control calculator 8. When the monitor wafer whose film thickness measurement is completed is placed on the wafer stage 13 by the carrying robot 11a, the carrying robot 11c carries it to the monitor wafer containing port 4 from the wafer stage 13.

By repeating the above motions 25 times, there are placed 25 monitor wafers on the monitor wafer containing port 4. These motions may be carried out at the time of the maintenance such as replacement of polishing pad or the like.

Figure 12:
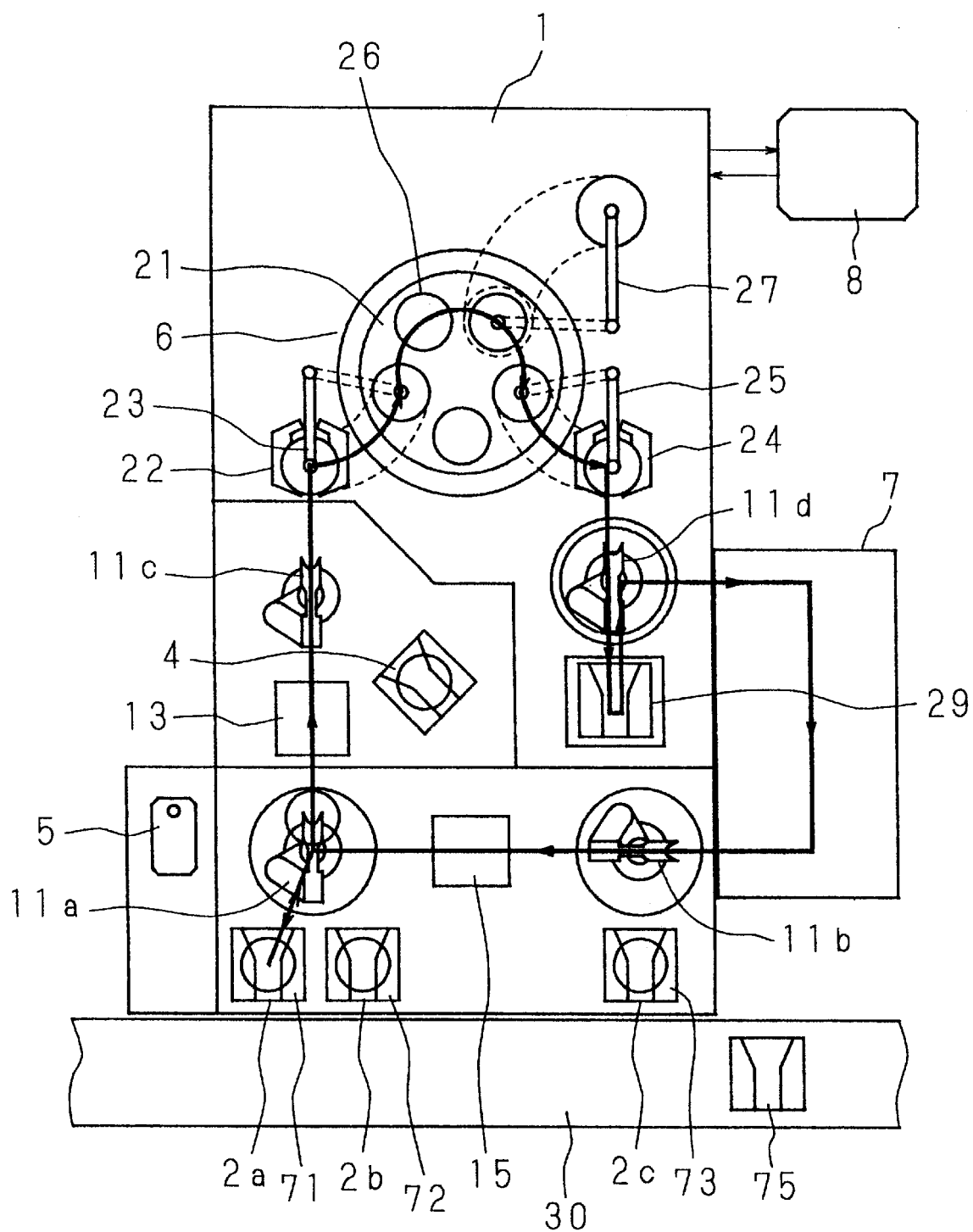
FIG. 12 is a schematic plan view showing a wafer flow in a product wafer polishing processing mode.

FIG. 12 is a schematic plan view showing the wafer flow in the product wafer polishing processing mode.

The wafer cassettes 71, 72 containing the product wafers are carried by the cassette carrying device 30 and placed on the cassette ports 2a, 2b.

The product wafer is taken out from the wafer cassettes 71, 72 by the carrying robot 11a and placed on the wafer stage 13. FIG. 12 shows the case of taking out a product wafer from the wafer cassette 71. The product wafer placed on the wafer stage 13 is carried to the wafer load lift 22 by the carrying robot 11c.

The product wafer is centered by the wafer load lift 22, carried to the wafer holder 26 on the wafer table 21 by the load side carrying arm 23, and held by the means such as vacuum adsorption.

Subsequently, the wafer table 21 is rotated by ⅕ turn, and in the same manner, the next product wafer is carried and held by another wafer holder 26. By repeating this motion five times, the wafers are held respectively in all wafer holder 26.

Then, the polishing board having polishing pad on the lower surface thereof descends, and while the slurry is supplied, either one or both of the polishing board and the wafer table 21 rotate to polish chemically and mechanically the surface of the product wafer.

After completion of polishing by the lapse of the predetermined time, the polishing board rises, and the scrub washing arm 27 rotates to wash the surface of the product wafer by scrubbing. And, after ⅕ rotation of the wafer table 21, the product wafer is taken out from the wafer holder 26 by the unload side carrying arm 25, carried to the unload lift 24, and further carried to the delivery waiting port 29 by the carrying robot 11d.

Subsequently, the wafer table 21 is rotated by ⅕, and in the same manner, the next product wafer held by another wafer holder 26 is carried to the delivery waiting port 29. By repeating such motion five times, the product wafers after polishing held by all wafer holders 26 are fully carried to the delivery waiting port 29.

Simultaneously with the above, on the carrying in side, a process to have the next product wafer hold by the wafer holder 26 is carried out.

The product wafers recovered by the delivery waiting port 29 is sequentially carried to the washing unit 7 by the carrying robot 11d, washed, and dried. Subsequently, the product wafer is placed on the wafer stage 15 by the carrying robot 11b, and returned to the original wafer cassettes 71, 72 by the carrying robot 11a.

Figure 13:
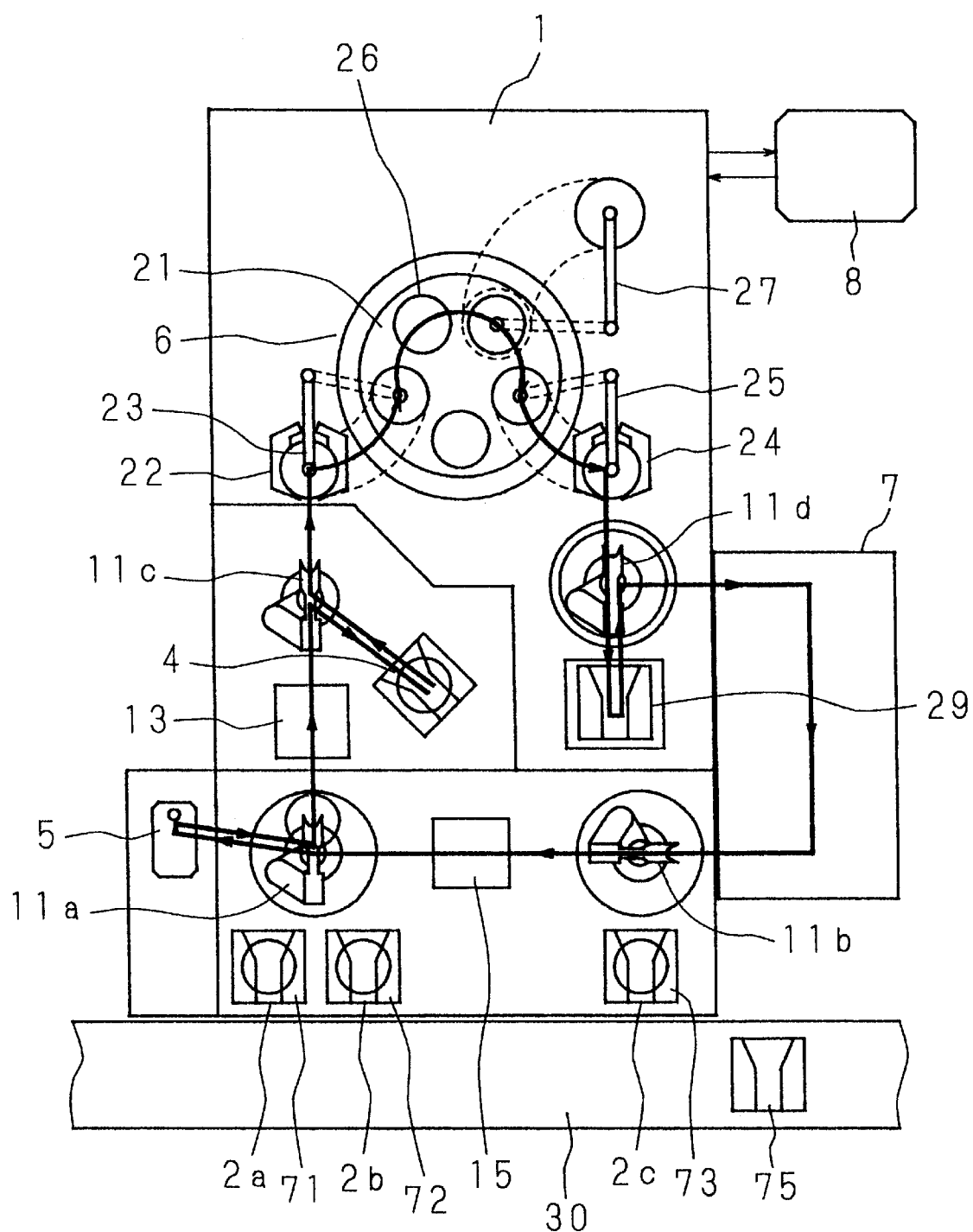
FIG. 13 is a schematic plan view showing a wafer flow in a monitor wafer polishing processing mode.

FIG. 13 is a schematic plan view showing the wafer flow in the monitor wafer polishing processing mode.

The monitor wafer contained in the monitor containing port 4 is taken out by the carrying robot 11c and placed on the wafer load lift 22. Thereafter, in the same manner as in the product wafer, the monitor wafer is passed through polishing and washing processes.

The monitor wafer washed in the washing unit 7 is placed on the wafer stage 15 by the carrying robot 11b, and further carried to the film thickness measuring unit 5 by the carrying robot 11a.

In the film thickness measuring unit 5, the film thickness of the monitor wafer after the polishing processing is measured, and the result of the film thickness measurement are sent to the control calculator 8.

The monitor wafer which completed the film thickness measurement is placed on the wafer stage 13 by the carrying robot 11a, and returned to the monitor wafer containing port 4 by the carrying robot 11c.

Figure 14:
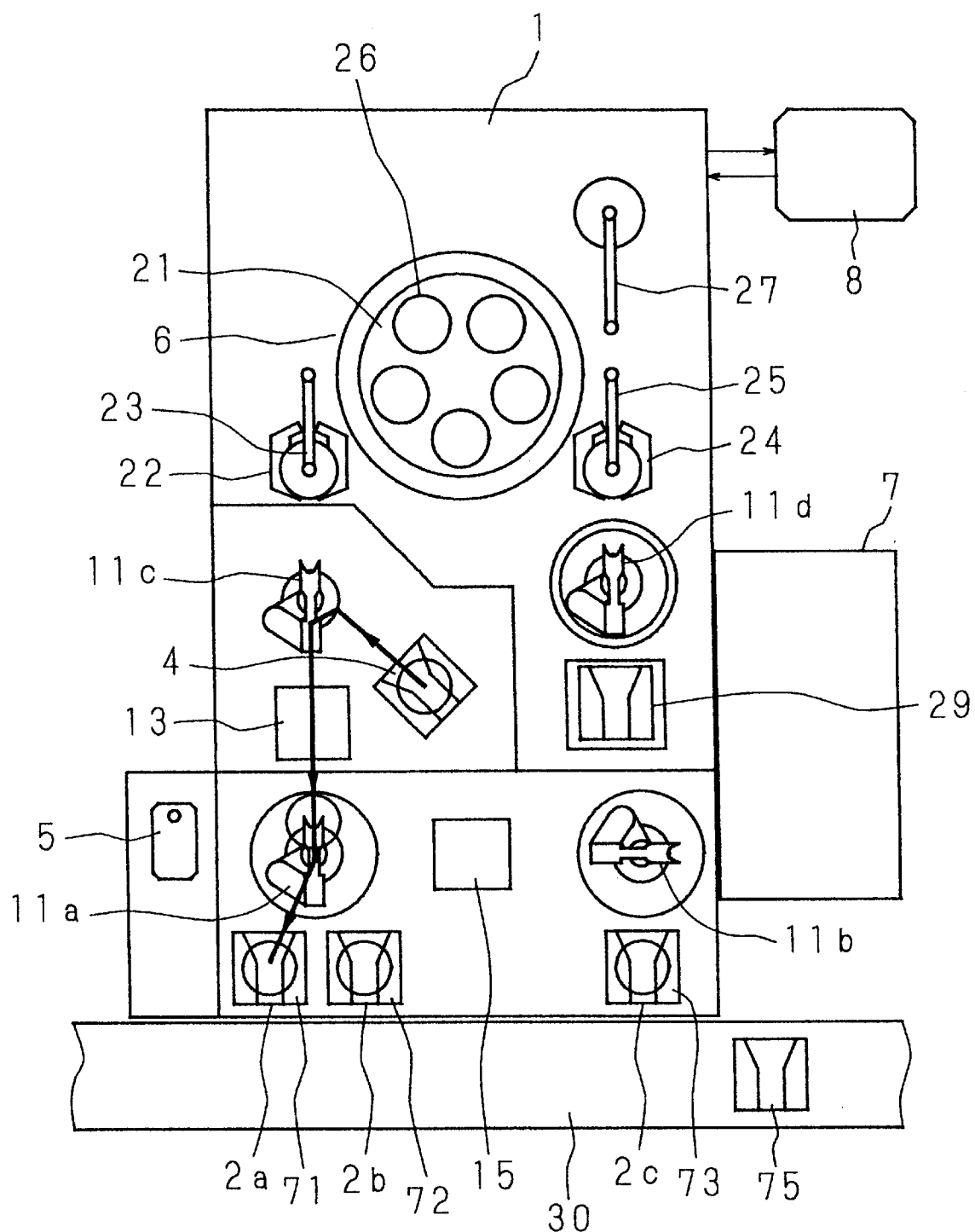
FIG. 14 is a schematic plan view showing a wafer flow in a monitor wafer recovery processing mode.

FIG. 14 is a schematic plan view showing the wafer flow in the monitor wafer recovery processing mode. The monitor wafer stored in the monitor wafer containing port 4 is taken out by the carrying robot 11c, placed on the wafer stage 13, and further carried by the carrying robot 11a to the empty wafer cassette 74 placed in the cassette port 2a.

By repeating such motion 25 times, 25 monitor wafers are recovered from the monitor wafer containing port 4 to the wafer cassette 74. This monitor wafer recovery motion may also be performed at the time of the maintenance such as the polishing pad replacement and the like, in the same manner as in the monitor wafer containing motion.

Figure 15:
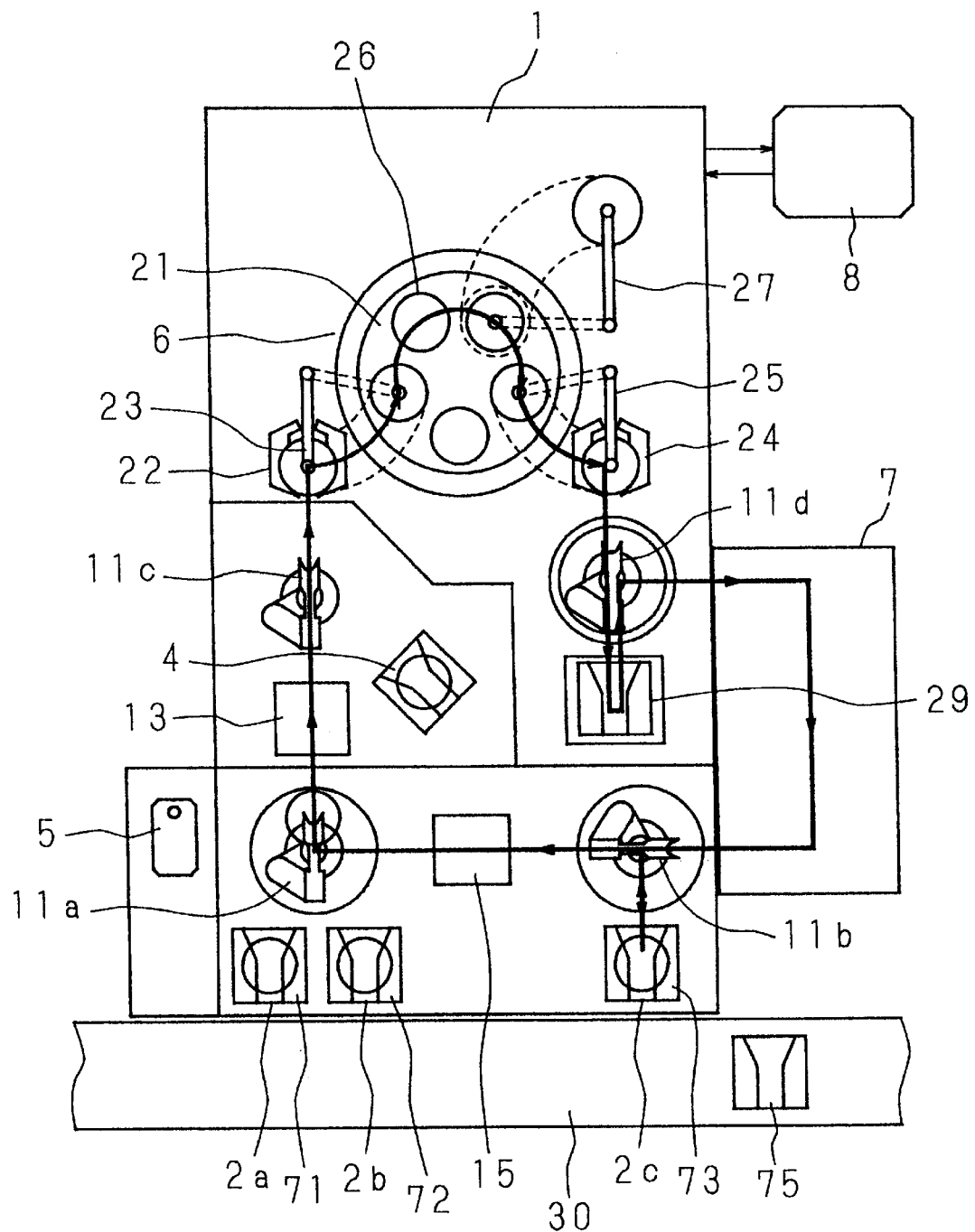
FIG. 15 is a schematic plan view showing a wafer flow in a dummy wafer polishing processing mode.

FIG. 15 is a schematic plan view showing the wafer flow in the dummy wafer polishing processing mode.

The flow of the dummy wafer is the same as the wafer flow at the polishing processing of the product wafer shown in FIG. 12, except that the dummy wafer is taken out from the dummy wafer cassette 73 stored in the cassette port 2c by the carrying robot 11b, and returned to the dummy wafer cassette 73 by the carrying robot 11b.

The dummy wafer cassette has a role, besides supplying a dummy wafer at the dummy wafer polishing processing, of supplying the dummy wafer to cover deficiency, in polishing processing of the product wafer, in case the product wafer is less than the predetermined number (for example, 5 wafers) for 1 batch.

By each wafer flow as above, the monitor wafer containing processing, product wafer polishing processing, monitor wafer polishing processing, monitor wafer recovery processing, and dummy wafer polishing processing can be practiced.

The polishing method in Embodiment 3 is equivalent to that in which the replacement of the pad and trial operation step S11 shown in FIG. 2 are replaced by all the steps S31–S40 shown in FIG. 7. That is to say, the routine operation process which is a routine product wafer polishing process is carried out by the method as explained in Embodiment 1, and the trial operation process after replacement of the polishing pad is carried out by the method as explained in Embodiment 2. These routine operation process and trial operation process are carried out by changing over between the judgment part A for routine operation process and the judgment part B for trial operation process in the control calculator 8.

Thus in the CMP device of Embodiment 3, the routine operation process and the trial operation process can be continuously practiced.

As shown in FIG. 13, the constitution is such that, in the polishing processing mode of the monitor wafer, the monitor wafer which is subjected to polishing processing is returned to the monitor wafer containing port 4. And, as the polishing situation index calculating unit 42 of the control calculator 8 is furnished with a film thickness memory unit, it can memorize the film thickness after polishing of the monitor wafer. Then, subsequent to the calculation of the polishing situation index, by replacing the film thickness of the monitor wafer after polishing as a film thickness before polishing and memorizing, it is possible to use the monitor wafer repeatedly and measure the polishing amount. Namely, by making the film of the monitor wafer sufficiently thick, repeated use of the monitor wafer is possible. As a result, the monitor wafer can be used in good efficiency, and it is possible to decrease the number of containing processing's of the monitor wafer and the number of recovery processing's to improve the operating rate of the CMP device.

Furthermore, by providing in the control calculator 8 the means for judging whether the remaining film thickness of the monitor wafer is sufficient to the removing amount in the next polishing processing or not and means for instructing the replacement of the monitor wafer when judged to be insufficient, control of the monitor wafer can be facilitated.

In the flow charts of FIGS. 2 and 7, the results of the polishing situation index by the polishing processing of the monitor wafer are directly reflected on the polishing conditions of the product wafer and polishing pad replacement, but they may be reflected on the polishing conditions of the product wafer and the replacement of the polishing pad after several batches.

Needless to say, the method and apparatus according to the present invention are applicable to various chemical and mechanical polishing such as flattening of blanket tungsten (W), flattening of copper (Cu) wiring in Damacin method, and the like in addition to the flattening of the inter-layer insulation film on the silicon wafer by the CMP method.

As described above, according to the present invention system, since the polishing amount is obtained by using the object to be polished for polishing amount monitor, the polishing situation can be accurately grasped. And, by carrying out the processing's such as to change the polishing conditions, and replace the polishing pad, and the like, with monitoring the polishing situation, polishing amount or uniformity in plane of polishing amount or the like can be stabilized. As a result, formation of defective product can be suppressed, and product yield can be improved.

Moreover, by automatically carrying out the trial operation automatically judging the completion of the trial operation after replacement of the polishing pad, intervention of man's work can be suppressed, and the work can be efficiently carried out. The constitution may be such as to make automatic setting of the polishing conditions after replacement of the polishing pad.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

$$\bar{x}_i = \frac{1}{17}\sum_{j=1}^{17} x_{ij} \quad (1)$$

$$\bar{x} = \frac{1}{5}\sum_{i=1}^{5} \bar{x}_i \quad (2)$$

$$\sigma_i = \frac{1}{\bar{x}_i}\sqrt{\frac{1}{17}\sum_{j=1}^{17}(x_{ij} - \bar{x}_i)^2} \times 100 \quad (3)$$

$$\bar{x}_{max} = \max(\bar{x}_1, \bar{x}_2, \bar{x}_3, \bar{x}_4, \bar{x}_5) \quad (4)$$

$$\bar{x}_{min} = \min(\bar{x}_1, \bar{x}_2, \bar{x}_3, \bar{x}_4, \bar{x}_5) \quad (5)$$

$$S = \frac{\bar{x}_{max} - \bar{x}_{min}}{\bar{x}_{max} + \bar{x}_{min}} \times 100 \quad (6)$$

$$\bar{x}_{i,out} = \frac{1}{8}\sum_{j=10}^{17} x_{ij} \quad (7)$$

$$\bar{x}_{i,in} = \frac{1}{5}\sum_{j=1}^{5} x_{ij} \quad (8)$$

$$K_i = \frac{\bar{x}_{i,out} - \bar{x}_{i,in}}{\bar{x}_i} \quad (9)$$

$$R_P = \frac{\bar{x}}{t_{mon}} \quad (10)$$

$$f(R_P) = k \cdot R_P \quad (11)$$

$$t_P = \frac{x_{aim}}{f(R_P)} \quad (12)$$

What is claimed is:

1. A polishing method, comprising the steps of:
    placing a wafer to be polished on a wafer holder;
    polishing a film on a surface of the wafer using a polishing pad;
    periodically placing a monitoring wafer which has a film on a surface thereof on said wafer holder;
    polishing the film of the monitoring wafer using said polishing pad;
    measuring a thickness of the film of the monitoring wafer;
    calculating a polishing amount of the monitoring wafer on the basis of the measured thickness of the film.

2. A polishing method according to claim 1, wherein the surface of the monitoring wafer is substantially flat, and the thickness of the film thereof is substantially uniform.

3. A polishing method according to claim 1, wherein the measurement of the film is carried out on a plurality of points on a line drawn from the center of the monitoring wafer to the periphery thereof.

4. A polishing method according to claim 1, further comprising the step of judging whether polishing situation is normal or not on the basis of said polishing amount.

5. A polishing method according to claim 4, further comprising the step of setting/changing polishing condition on the basis of said polishing amount.

6. A polishing method according to claim 1, further comprising the step of judging whether there is necessity or not for replacing the polishing pad on the basis of said polishing amount.

7. A polishing method according to claim 5, further comprising the step of judging whether there is necessity or not for replacing the polishing pad on the basis of said polishing amount.

8. The polishing method according to claim 1, further comprising the steps of:
    placing a dummy wafer for run-in polishing on said wafer holder after replacement of the polishing pad;
    polishing the dummy wafer using the replaced polishing pad;
    placing the monitoring wafer on said wafer holder after polishing the dummy wafer;
    polishing the film of the monitoring wafer;
    measuring the thickness of the film of the monitoring wafer;
    calculating a polishing amount of the monitoring wafer on the basis of the measured thickness;
    judging completion of the run-in polishing on the basis of said polishing amount.

9. A polishing method according to claim 8 further including a step of washing the polished monitoring wafer and wherein said measuring step includes optically measuring the film of the washed monitor wafer.

10. A polishing method according to claim 1 further including a step of washing the polished monitoring wafer and wherein said measuring step includes optically measuring the film of the washed monitor wafer.

11. A polishing method, comprising the steps of;
placing a wafer to be polished on a wafer holder:
polishing a film on a surface of the wafer using a polishing pad;
judging, after the polishing step, whether a polishing situation should be monitored or not;
repeating the placing step, the polishing step and the judging step in the case where the judging step judges that the polishing situation should not be monitored;
placing a monitoring wafer which has a film on a surface thereof on said wafer holder, and polishing the film of the monitoring wafer using said polishing pad in the case where the judging step judges that the polishing situation should be monitored;
measuring thickness of the film of the monitoring wafer;
calculating a polishing amount on the basis of the result of the measurement.

12. The polishing method according to claim 11, wherein the judgment, in the judging step, whether the polishing situation should be monitored or not is made according to whether the polishing of the polishing step is completed for a predetermined number of wafers.

13. The polishing method according to claim 11, further comprising the steps of;
judging whether the polishing situation is normal or not on the basis of said polishing amount.

14. A polishing method, comprising the steps of:
placing a wafer to be polished on a wafer holder:
polishing a film on a surface of the wafer using a polishing pad;
judging whether a polishing process of the placing step and the polishing step is completed for a predetermined number of wafers;
repeating the polishing process until the completion of polishing of the predetermined number of wafers, in the case where the judging step judges that the polishing process is not completed for the predetermined number of wafers;
placing a monitoring wafer which has a film on a surface thereof on said wafer holder, and polishing the film of the monitoring wafer using said polishing pad, in the case where the judging step judges that the polishing process is completed for the predetermined number of wafers;
measuring thickness of the film at a plurality of points on a line drawn from a center to a periphery of the monitoring wafer;
calculating polishing situation index on the basis of the measured thickness of the film;
judging whether said polishing situation index is within an allowable range or not.

15. The polishing method according to claim 14, further comprising the steps of:
stopping the polishing operation temporarily in the case where it is judged, in the secondly recited judging step, that said polishing situation index is not within an allowable range.

16. The polishing method according to claim 14, wherein said polishing situation index includes uniformity of polishing amount in a wafer plane.

17. The polishing method according to claim 16, wherein said polishing situation index includes uniformity of polishing amount in an wafer plane.

18. The polishing method according to claim 14, wherein said polishing situation index includes polishing speed.

19. The polishing method according to claim 18, further comprising the steps of:
changing polishing conditions on the basis of the result of judgment of the secondly recited judging step.

20. A polishing method, comprising the steps of:
placing a wafer to be polished on a wafer holder;
polishing a film on a surface of the wafer using a polishing pad:
judging whether a polishing process of the placing step and the polishing step is completed for a predetermined number of wafers;
repeating the polishing process until the completion of polishing of the predetermined number of wafers, in the case where the judging step judges that the polishing process is not completed for the predetermined number of wafers;
placing a monitoring wafer, which has a film on a surface thereof, on said wafer holder, and polishing the film of the monitoring wafer using said polishing pad in the case where the judging step judges that the polishing process is completed for the predetermined number of wafers;
washing the polished monitoring wafer;
optically measuring thickness of the film of the washed monitoring wafer;
calculating polishing situation index on the basis of the result of the measurement of the film thickness;
judging whether the polishing step is temporarily stopped or not, using the calculated polishing situation index;
judging whether there is necessity or not for replacing the polishing pad in the case where the secondly mentioned judging step judges that the polishing operation is not temporarily stopped;
judging whether there is necessity or not for changing polishing conditions in the case where the thirdly recited judging step judges that there is not necessity to change the polishing pad, and changing the polishing conditions in the case where the thirdly recited judging step judges there is necessity for changing the polishing conditions.

21. The polishing method according to claim 20, wherein said polishing situation index includes the polishing speed and uniformity of polishing amount in an wafer plane.

22. The polishing method according to claim 21, wherein said polishing conditions includes a length of polishing period.

23. A method for polishing a film on surfaces of semiconductor wafers, including the steps of:
placing a batch of one or more of the semiconductor wafers on a wafer holder;
polishing the film on the surface of each of said batch of one or more semiconductor wafers on said wafer holder with a polishing pad for a period to remove an intended amount of film from the surface of said batch of one or more semiconductor wafers;
removing said batch of one or more semiconductor wafers from said wafer holder after said period is complete;
repeating the previously recited placing, polishing, and removing steps using said polishing pad for a predetermined number of batches of said one or more semiconductor wafers;

then placing on said wafer holder a batch of one or more monitoring wafers each with a film on a surface thereof;

polishing for a period said film on said batch of one or more monitoring wafers using said polishing pad;

measuring a thickness of the batch of one or more monitoring wafers after said polishing step;

calculating a polishing amount of the monitoring wafer film on the basis of the measured thickness of the batch of one or more monitoring wafers.

24. A method for polishing a film on semiconductor wafers as in claim 23 wherein each batch of semiconductor wafers includes a plurality of wafers that are disposed at different locations on said carrier, each batch of monitoring wafers includes a plurality of wafers disposed at said different locations on said carrier, and said calculating step includes determining the uniformity of polishing amount with respect to carrier location.

* * * * *